United States Patent
Guo et al.

(10) Patent No.: US 7,082,583 B2
(45) Date of Patent: Jul. 25, 2006

(54) METHOD FOR REDUCING A PARASITIC GRAPH IN MOMENT COMPUTATION IN VLSI SYSTEMS

(75) Inventors: Weiqing Guo, Fremont, CA (US); Sandeep Bhutani, Sunnyvale, CA (US)

(73) Assignee: LSI Logic Corporation, Milpitas, CA (US)

(*) Notice: Subject to any disclaimer, the term of this patent is extended or adjusted under 35 U.S.C. 154(b) by 370 days.

(21) Appl. No.: 10/301,069

(22) Filed: Nov. 20, 2002

(65) Prior Publication Data

US 2004/0098677 A1 May 20, 2004

(51) Int. Cl.
*G06F 17/50* (2006.01)

(52) U.S. Cl. .................. 716/4; 703/13; 703/14
(58) Field of Classification Search ............. 716/4; 703/13, 14; 403/14
See application file for complete search history.

(56) References Cited

U.S. PATENT DOCUMENTS

| | | | | |
|---|---|---|---|---|
| 5,379,231 A | * | 1/1995 | Pillage et al. ............. | 703/14 |
| 5,469,366 A | * | 11/1995 | Yang et al. ............... | 716/6 |
| 6,789,237 B1 | * | 9/2004 | Ismail ...................... | 716/4 |

OTHER PUBLICATIONS

Pillage, Lawrence T. et al., "Asymptotic Wafeform Evaluation for Timing Analysis," IEEE, vol. 9, No. 4, Apr. 1990, pp. 352-366.
Ratzlaff, Curtis L. et al., "RICE: Rapid Interconnect Circuit Evaluation Using AWE," IEEE, vol. 13, No. 6, Jun. 1994, pp. 763-776.

* cited by examiner

*Primary Examiner*—A. M. Thompson
(74) *Attorney, Agent, or Firm*—Strategic Patent Group (57) ABSTRACT

An improved method for interconnect delay analysis for VLSI circuits reduces a parasitic graph for moment computation by eliminating one or more nodes in the graph. The elimination process is performed based upon the degree of the nodes. By eliminating nodes in this fashion, the computation complexity is significantly reduced. With this elimination process, resistor loops and crossed loops can also be solved. The order in which the nodes are eliminated is optimized using the depth-first-search method on the parasitic graphs, further reducing the computation complexity. The method provides a consistent functional interface, applicable to different circuit model structures. In addition, the method accounts for coupling capacitance between interconnects.

7 Claims, 13 Drawing Sheets

$$\begin{bmatrix} \frac{1}{R_{10}}+\frac{1}{R_{12}} & -\frac{1}{R_{12}} & 0 & 0 & 0 \\ -\frac{1}{R_{12}} & \frac{1}{R_{12}}+\frac{1}{R_{23}} & -\frac{1}{R_{23}} & 0 & 0 \\ 0 & -\frac{1}{R_{23}} & \frac{1}{R_{23}}+\frac{1}{R_{34}} & -\frac{1}{R_{34}} & 0 \\ 0 & 0 & -\frac{1}{R_{34}} & \frac{1}{R_{34}}+\frac{1}{R_{45}} & -\frac{1}{R_{45}} \\ 0 & 0 & 0 & -\frac{1}{R_{45}} & \frac{1}{R_{45}} \end{bmatrix} \cdot \begin{bmatrix} V_1 \\ V_2 \\ V_3 \\ V_4 \\ V_5 \end{bmatrix} = \begin{bmatrix} I_{10} \\ I_{20} \\ I_{30} \\ I_{40} \\ I_{50} \end{bmatrix}$$

$$\begin{bmatrix} \frac{1}{R_{10}}+\frac{1}{R_{12}} & -\frac{1}{R_{12}} & 0 & 0 & 0 \\ -\frac{1}{R_{12}} & \frac{1}{R_{12}}+\frac{1}{R_{23}} & -\frac{1}{R_{23}} & 0 & 0 \\ 0 & -\frac{1}{R_{23}} & \frac{1}{R_{23}}+\frac{1}{R_{34}} & -\frac{1}{R_{34}} & 0 \\ 0 & 0 & -\frac{1}{R_{34}} & \frac{1}{R_{34}} & 0 \\ 0 & 0 & 0 & -\frac{1}{R_{45}} & \frac{1}{R_{45}} \end{bmatrix} \cdot \begin{bmatrix} V_1 \\ V_2 \\ V_3 \\ V_4 \\ V_5 \end{bmatrix} = \begin{bmatrix} I_{10} \\ I_{20} \\ I_{30} \\ I_{40}+I_{50} \\ I_{50} \end{bmatrix}$$

FIG. 3

$$\begin{bmatrix} \frac{1}{R_{10}}+\frac{1}{R_{12}} & -\frac{1}{R_{12}} & & \\ -\frac{1}{R_{12}} & \frac{1}{R_{12}}+\frac{1}{R_{23}} & -\frac{1}{R_{23}} & \\ & -\frac{1}{R_{23}} & \frac{1}{R_{23}}+\frac{1}{R_{34}} & -\frac{1}{R_{34}} \\ & & -\frac{1}{R_{34}} & \frac{1}{R_{34}} \end{bmatrix} \cdot \begin{bmatrix} V_1 \\ V_2 \\ V_3 \\ V_4 \end{bmatrix} = \begin{bmatrix} I_{10} \\ I_{20} \\ I_{30} \\ I_{40}+I_{50} \end{bmatrix}$$

$$\begin{bmatrix} \frac{1}{R_{10}}+\frac{1}{R_{12}}+\frac{1}{R_{15}} & -\frac{1}{R_{12}} & 0 & 0 & -\frac{1}{R_{15}} \\ -\frac{1}{R_{12}} & \frac{1}{R_{12}}+\frac{1}{R_{23}} & -\frac{1}{R_{23}} & 0 & 0 \\ 0 & -\frac{1}{R_{23}} & \frac{1}{R_{23}}+\frac{1}{R_{34}} & -\frac{1}{R_{34}} & 0 \\ 0 & 0 & -\frac{1}{R_{34}} & \frac{1}{R_{34}}+\frac{1}{R_{45}} & -\frac{1}{R_{45}} \\ -\frac{1}{R_{10}} & 0 & 0 & -\frac{1}{R_{45}} & \frac{1}{R_{15}}+\frac{1}{R_{45}} \end{bmatrix} \cdot \begin{bmatrix} V_1 \\ V_2 \\ V_3 \\ V_4 \\ V_5 \end{bmatrix} = \begin{bmatrix} I_{10} \\ I_{20} \\ I_{30} \\ I_{40} \\ I_{50} \end{bmatrix}$$

FIG. 5B

$$\begin{bmatrix} \frac{1}{R_{10}} + \frac{1}{R_{12}} + \frac{1}{R_{15}+R_{45}} & -\frac{1}{R_{12}} & 0 & 0 & -\frac{1}{R_{15}+R_{45}} \\ -\frac{1}{R_{12}} & \frac{1}{R_{12}} + \frac{1}{R_{23}} & -\frac{1}{R_{23}} & 0 & 0 \\ 0 & -\frac{1}{R_{23}} & \frac{1}{R_{23}} + \frac{1}{R_{34}} & -\frac{1}{R_{34}} & 0 \\ -\frac{1}{R_{15}+R_{45}} & 0 & -\frac{1}{R_{34}} & \frac{1}{R_{34}} + \frac{1}{R_{15}+R_{45}} & -\frac{R_{15}}{R_{15}+R_{45}} \\ \frac{R_{45}}{R_{15}+R_{45}} & 0 & 0 & \frac{R_{15}}{R_{15}+R_{45}} & 1 \end{bmatrix} \cdot \begin{bmatrix} V_1 \\ V_2 \\ V_3 \\ V_4 \\ V_5 \end{bmatrix} = \begin{bmatrix} \frac{R_{45}}{R_{15}+R_{45}} I_{10} \\ I_{20} \\ I_{30} \\ I_{40} + \frac{R_{15}}{R_{15}+R_{45}} I_{50} \\ \frac{R_{15} * R_{45}}{R_{15}+R_{45}} I_{50} \end{bmatrix}$$

METHOD FOR REDUCING A PARASITIC GRAPH IN MOMENT COMPUTATION IN VLSI SYSTEMS

FIELD OF THE INVENTION

The present invention relates to asymptotic waveform evaluation (AWE), and more particularly to the use of AWE in moment computations in VLSI interconnect delay and cross-talk analysis.

BACKGROUND OF THE INVENTION

As is known in the art, interconnects between gates in Very Large Scale Integration (VLSI) chips cause propagation delays in the circuit. To approximate the actual delay, the interconnects are modeled with a circuit comprising resistors, inductors, and capacitors, i.e., an RLC interconnect model. For linear RLC circuits, the Asymptotic Waveform Evaluation (AWE) technique provides circuit response approximations. The transient portion of the response is approximated by matching the initial boundary conditions and the first 2q−1 moments of the exact response to a lower order q-pole model.

Figure 1A:
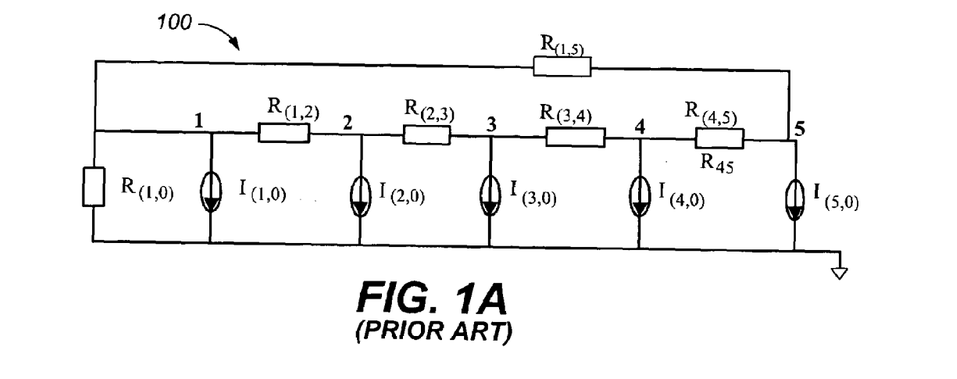
FIG. 1A illustrates an example model circuit.
Figure 1B:
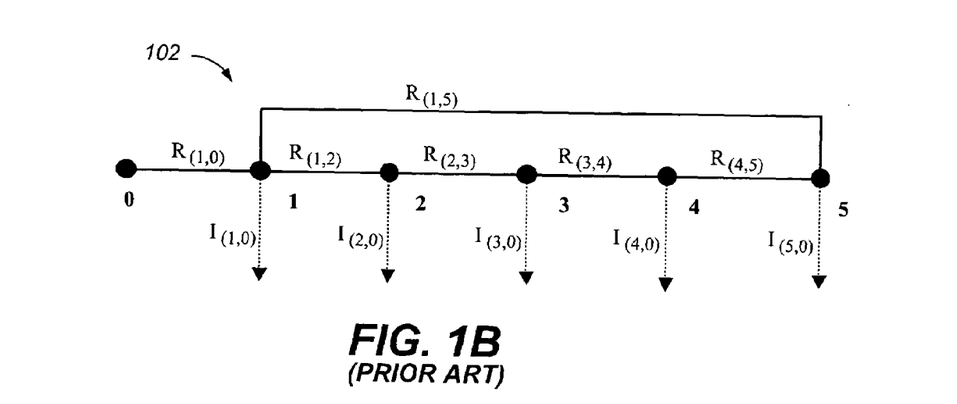
FIG. 1B illustrates the parasitic graph representation of the example model circuit.

FIG. 1A illustrates an example model circuit. In the example model circuit 100, the capacitors have been replaced by current sources. (There were no inductors and thus no voltage sources.) The moments are represented by the voltages at each node of the circuit. To more easily represent these nodes, the example circuit 100 is represented by a parasitic graph. FIG. 1B illustrates the parasitic graph representation of the example model circuit. In the graph 102, each node is represented by a dot, each resistor is represented by an edge, and each current source is represented by an arrow.

The RLC interconnect model is first reduced and simplified. The delay and waveform at any point of the circuit are then determined by the poles and residues at that point. The poles and residues can be computed using the moments at the same point. Moments are computed by solving the DC solution of the circuit with capacitors replaced by current sources and inductors replaced by voltage sources.

However, in the ever-increasing complexity of circuits and the interconnects in VLSI design, there are hundreds or thousands or more nodes in the circuits. The conventional delay analysis using AWE is prohibitive for these cases. Also, the algorithm for the analysis has different approaches for different types of model circuits structures, and the amount of computation to obtain the moments are also not optimized.

Accordingly, there exists a need for an improved method for interconnect delay analysis for VLSI circuits. The improved method should be generalized for different types of model circuit structures and optimized to reduce the complexity of the computations. The present invention addresses such a need.

SUMMARY OF THE INVENTION

An improved method for interconnect delay analysis for VLSI circuits reduces a parasitic graph for moment computation by eliminating one or more nodes in the graph. The elimination process is performed based upon the degree of the nodes. By eliminating nodes in this fashion, the computation complexity is significantly reduced. With this elimination process, resistor loops and crossed loops can also be solved. The order in which the nodes are eliminated is optimized using the depth-first-search method on the parasitic graphs, further reducing the computation complexity. The method provides a consistent functional interface, applicable to different circuit model structures. In addition, the method accounts for coupling capacitance between interconnects.

BRIEF DESCRIPTION OF THE FIGURES

FIGS. 2A–4B illustrate the elimination of a node with degree 1 in the graph reduction algorithm for moment computation in accordance with the present invention.

FIGS. 5A–7B illustrate the elimination of a node with degree 2 in the graph reduction algorithm for moment computation in accordance with the present invention.

FIGS. 8–9B illustrate the elimination of a node with degree 3 in the graph reduction algorithm for moment computation in accordance with the present invention.

DETAILED DESCRIPTION

The present invention provides an improved method for interconnect delay analysis for VLSI circuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The method in accordance with the present invention reduces a parasitic graph for moment computation by eliminating one or more nodes in the graph. The elimination process is performed based upon the degree of the nodes. By eliminating nodes in this fashion, the computation complexity is significantly reduced. With this elimination process, resistor loops and crossed loops can also be solved. The order in which the nodes are eliminated is optimized using the depth-first-search method on the parasitic graphs, further reducing the computation complexity. The method provides a consistent functional interface, applicable to different circuit model structures. In addition, the method accounts for coupling capacitance between interconnects with the setting of the initial voltages for the nodes.

To more particularly describe the features of the present invention, please refer to FIGS. 2A through 14 in conjunction with the discussion below.

The graph reduction algorithm for moment computation in accordance with the present invention will first be described with reference to FIGS. 2A–13. Then the graph reduction algorithm as used in a moment computation algorithm in accordance with the present invention will then be described with reference to FIG. 14.

To describe the graph reduction algorithm for moment computation, the node elimination process in accordance with the present invention for different degrees of nodes is first described with reference to FIGS. 2A–10. In this specification, a number of "degrees" for a node refers to the number of edges extending from the node in a parasitic graph. Then, the optimization process of the order of node elimination is described with reference to FIGS. 11–12. The graph reduction algorithm itself is then described with the flowcharts illustrated in FIGS. 13A–13B in the context of the node elimination process and the order optimization process.

Figure 2A:
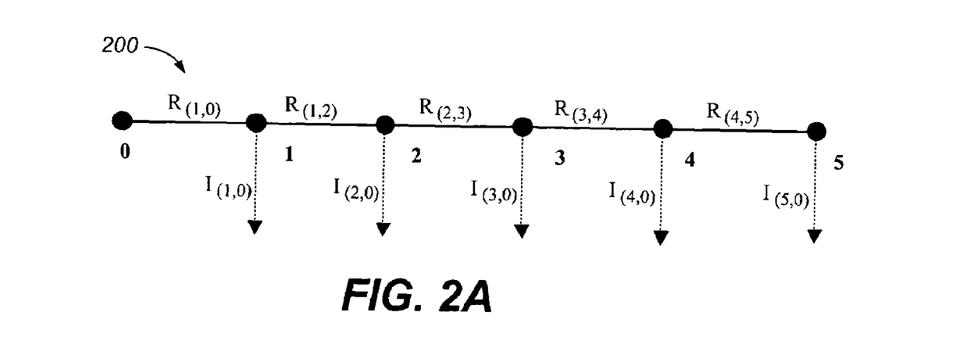
Figure 4A:
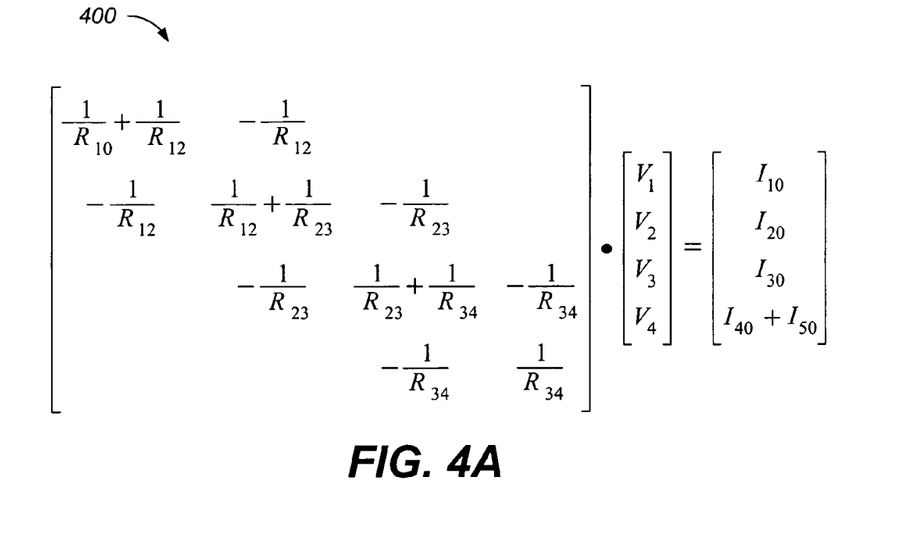
Figure 4B:
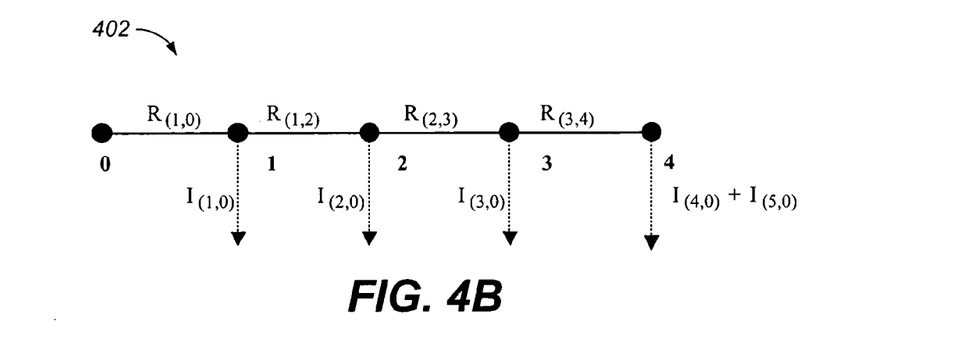

FIGS. 2A–4B illustrate the elimination of a node with degree 1 in the graph reduction algorithm for moment computation in accordance with the present invention. FIG. 2A illustrates a graph 200 for an example circuit. For the graph 200 in FIG. 2A, node 5 has a degree of 1. (The arrow representing the current sourse, $I_{(5,0)}$ is not an "edge".) FIG. 2B illustrates a matrix 202 for the graph 200. Each edge on the graph 200 corresponds to a non-zero entry in the matrix 202. Typically, the matrix of a parasitic graph is a sparse, symmetric matrix. The algorithm in accordance with the present invention takes advantage of this. To eliminate node 5 from the graph 200, row 5 in the matrix 202 is added to row 4, resulting in the matrix 300 illustrated in FIG. 3. Column 5 in the matrix 300 has only one non-zero entry. This means that the variable $V_5$ is no longer coupled with the others. Thus, only four unknowns must be solved simultaneously to obtain the moments. Once these unknowns are solved, $V_5$ can be solved with the equation: $V_5=V_4+R_{45}*I_{50}$. The matrix 300 can thus be changed to the matrix 400, illustrated in FIG. 4A. FIG. 4B illustrates a reduced graph 402 represented by the matrix 400. In this manner, a node with a degree of 1 is eliminated. With the elimination of node 5, the computation required to solve the reduced matrix 400 is significantly reduced. This node elimination process for nodes with degree 1 can be recursively applied. For example, once node 5 is eliminated, node 4 now has a degree of 1. The same process performed with node 5 can be repeated with node 4. With the graph 200, the entire graph 200 can be reduced to a single unknown node, node 1, and ground node, node 0. $V_1$ can then be solved, which is then used to solve for $V_2$, then $V_3$, then $V_4$, and finally $V_5$. The moments for the graph 200 can thus be computed.

Figure 5A:
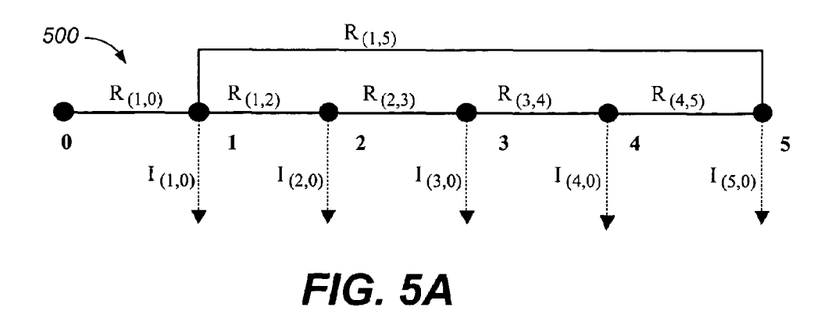

FIGS. 5A–7B illustrate the elimination of a node with degree 2 in the graph reduction algorithm for moment computation in accordance with the present invention. FIG. 5A illustrates a graph for another example circuit. For the graph 500 in FIG. 5A, node 5 has a degree of 2. FIG. 5B illustrates a matrix 502 for the graph 500. Row 5 can be multiplied by $$\frac{R_{15}*R_{45}}{R_{15}+R_{45}}.$$

Figure 5B:
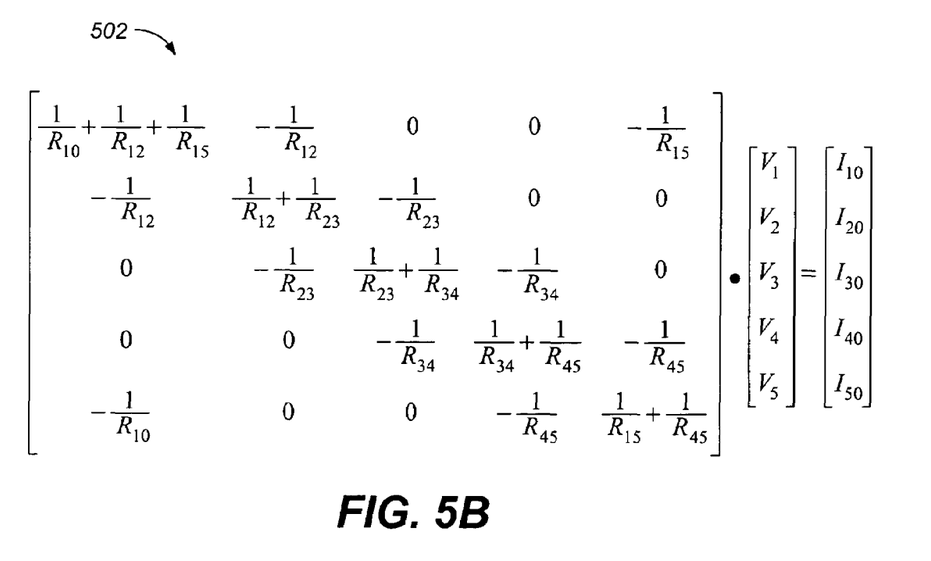
Figure 6:
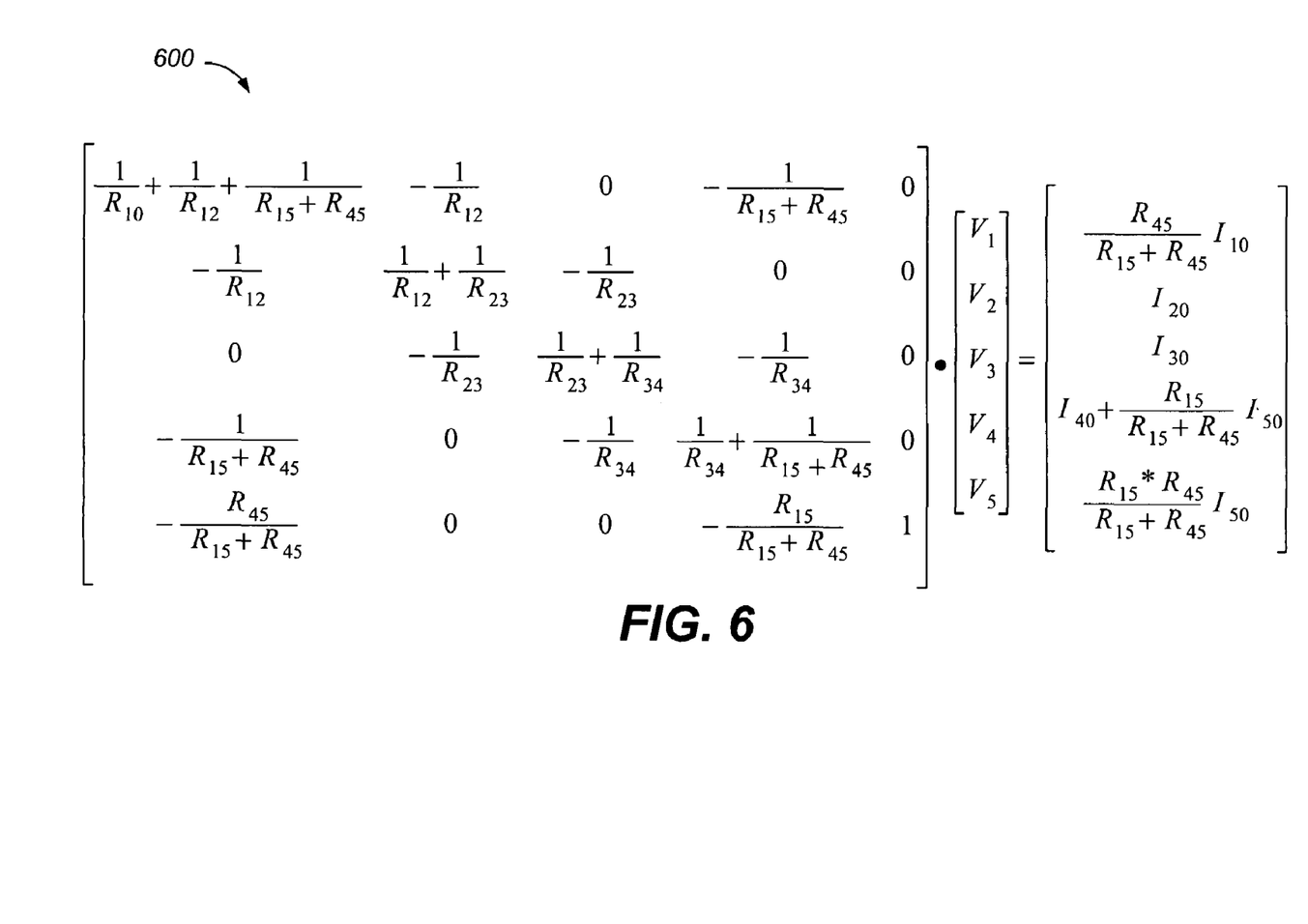

The modified row 5 can then be multiplied by $$\frac{1}{R_{45}}$$

and added to row 4. Row 5 can then be multiplied by $$\frac{1}{R_{45}}$$

and added to row 1. The result is the matrix 600, illustrated in FIG. 6. Column 5 in the matrix 600 has only one non-zero entry. This means that the variable $V_5$ is no longer coupled with the others. Thus, only four unknowns must be solved simultaneously to obtain the moments. Once these unknowns are solved, $V_5$ can be solved with the equation:

$$V_5=\frac{R_{45}*V_1+R_{15}*V_4+R_{15}*R_{45}*I_{50}}{R_{15}+R_{45}}.$$

Figure 7A:
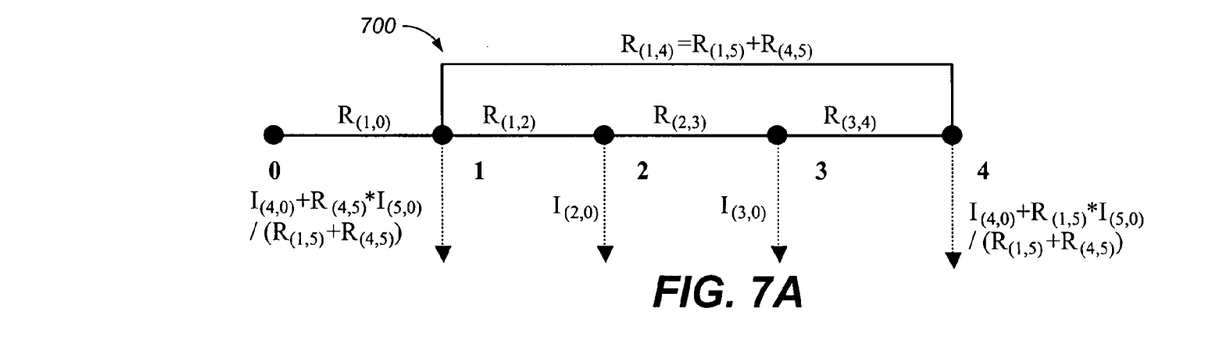
Figure 7B:
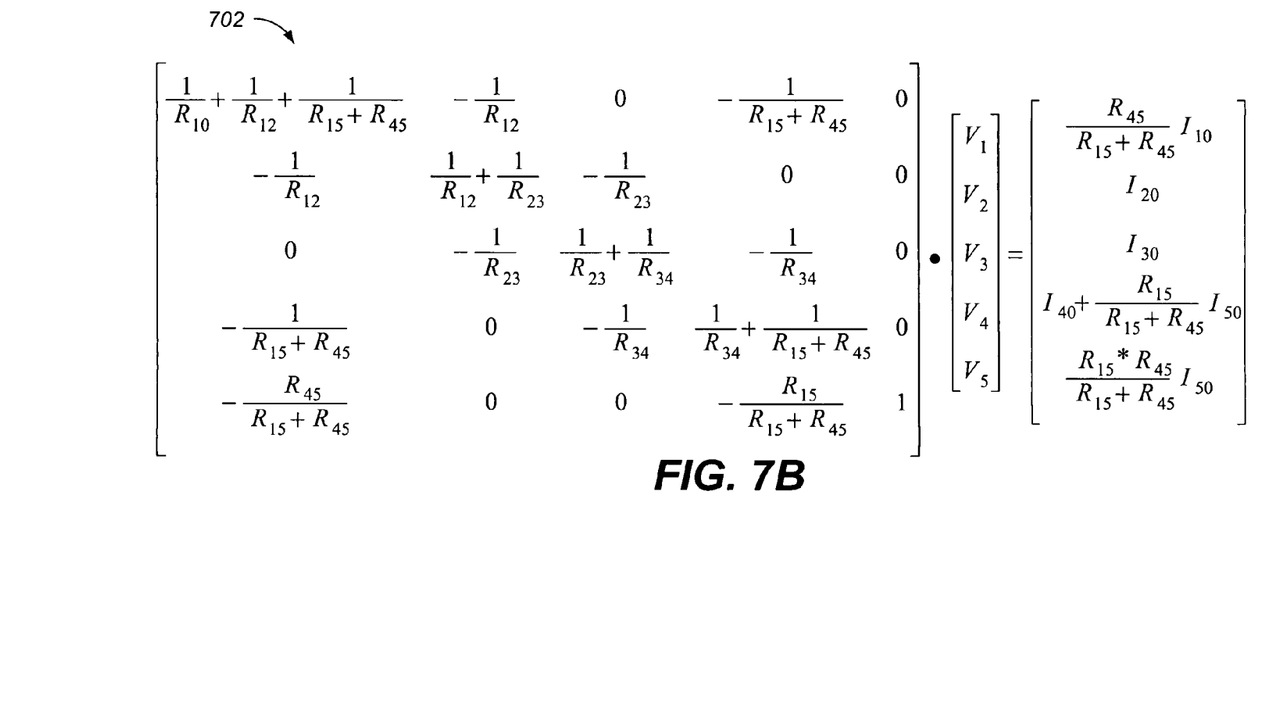

Node 5 can thus be eliminated, resulting in the reduced graph 700, illustrated in FIG. 7A. The changed matrix 702, illustrated in FIG. 7B, represents the reduced graph 700. This node elimination process for nodes with degree 2 can be recursively applied. For example, once node 5 is eliminated, node 4 now has a degree of 2. The same process performed with node 5 can be repeated with node 4. With the graph 500, the entire graph 500 can reduced to a single unknown node, node 1, and ground node, node 0. $V_1$ can then be solved, which is then used to solve for $V_2$, then $V_3$, then $V_4$, and finally $V_5$. The moments for the graph 500 can thus be computed.

Figure 8:
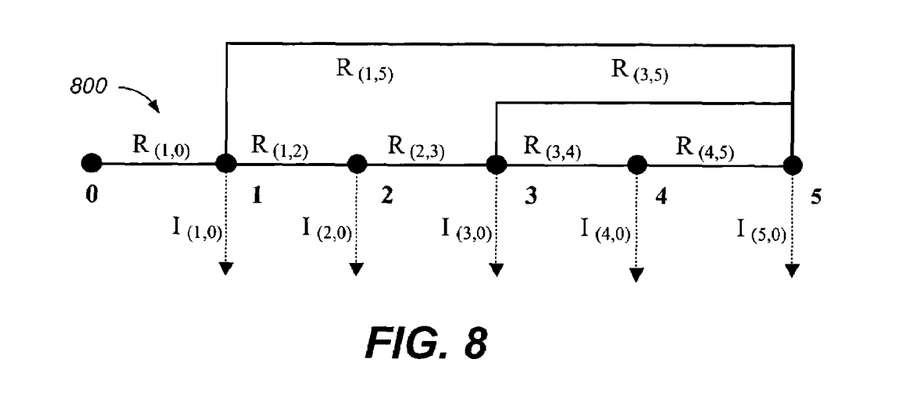
Figure 9A:
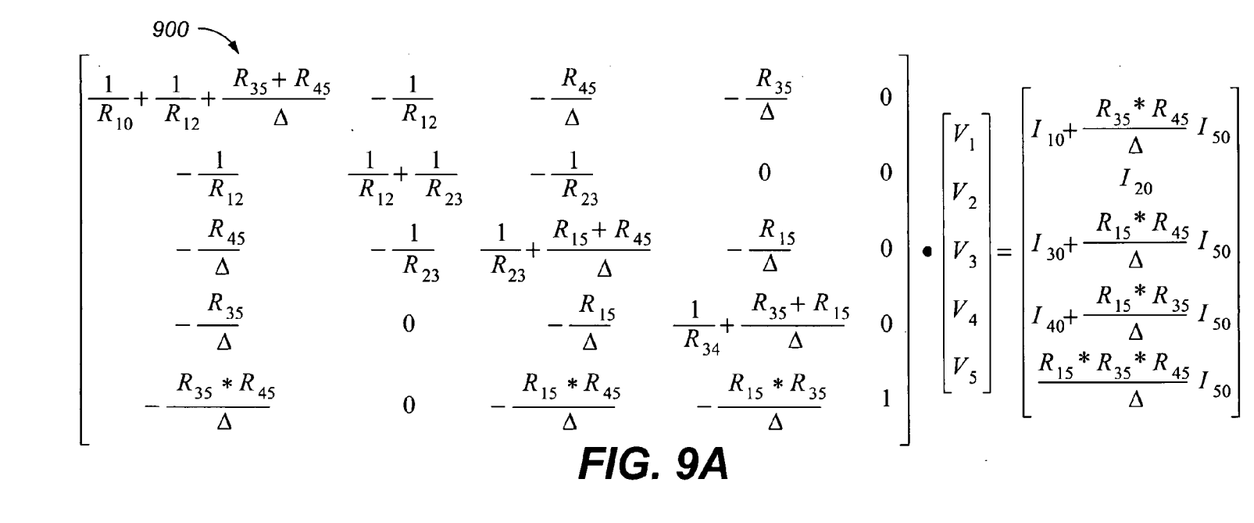
Figure 9B:
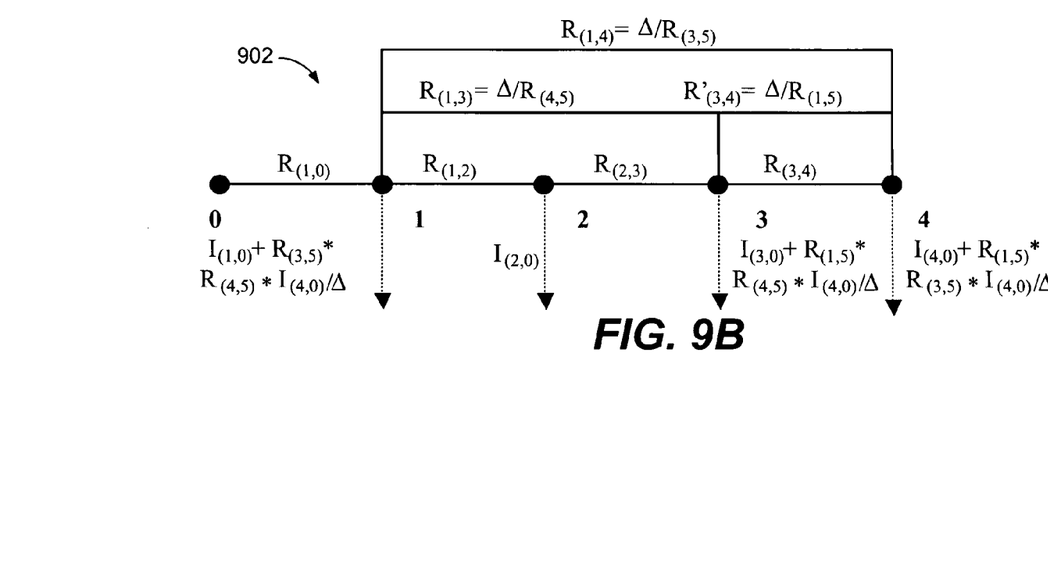

FIGS. 8–9B illustrate the elimination of a node with degree 3 in the graph reduction algorithm for moment computation in accordance with the present invention. FIG. 8 illustrates a graph 800 for a third example circuit. The graph 800 comprises two nested resistor loops, and has node 5 with a degree of 3. The matrix for the graph 800 is changed using similar strategies used in eliminating nodes with degrees 1 or 2, resulting in the changed matrix 900, illustrated in FIG. 9A, where $\Delta=R_{15}*R_{35}+R_{15}*R_{45}+R_{35}*R_{45}$. Node 5 can now be eliminated. FIG. 9B illustrates the reduced graph 902. Node 4 now has a degree of 3 and can be eliminated in the same manner as node 5. This node elimination can be recursively applied. The moments for the graph 800 with nested resistor loops can thus be computed.

Nodes of degrees of 4 or greater are rare in moment computations, if fewer degree nodes are eliminated first. However, they may also be eliminated using similar strategies as with nodes of degrees 1–3 without departing from the spirit and scope of the present invention.

Figure 10:
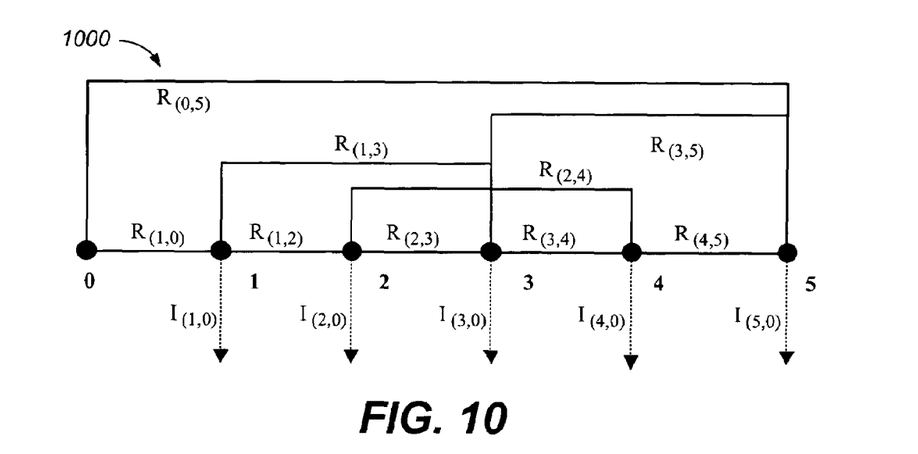
FIG. 10 illustrates an example of a graph with crossed resistor loops that is reducible with the graph reduction algorithm in accordance with the present invention.

In addition to facilitating moment computation for graphs with nested resistor loops, the node elimination processes in accordance with the present invention also facilitates moment computation for graphs with crossed resistor loops. FIG. 10 illustrates an example of a graph 1000 with crossed resistor loops that is reducible with the graph reduction algorithm in accordance with the present invention, described above. Nodes 1, 2, 4, and 5 have degree of 3 and can be eliminated using the degree 3/degree 2/degree 1 processes. Node 3 is also reducible with the degree 3 process since its degree is reduced to 3 after the elimination of node 2 or 4.

The complexity of moment computations can be further reduced by optimizing the order in which nodes are eliminated. To determine the optimal order, a parasitic graph is created. The, the depth-first-search (DFS) technique is performed on the parasitic graph. The DFS technique begins with a root node and explores the graph's descendent nodes. When all of the descendent nodes have been explored, the DFS technique returns to the ancestor/parent node of the current node. As the DFS returns to the ancestor/parent node, the node elimination process is performed. This insures that node with degree 1 is eliminated before its ancestor/parent nodes that may have degree 2 or more.

Figure 11:
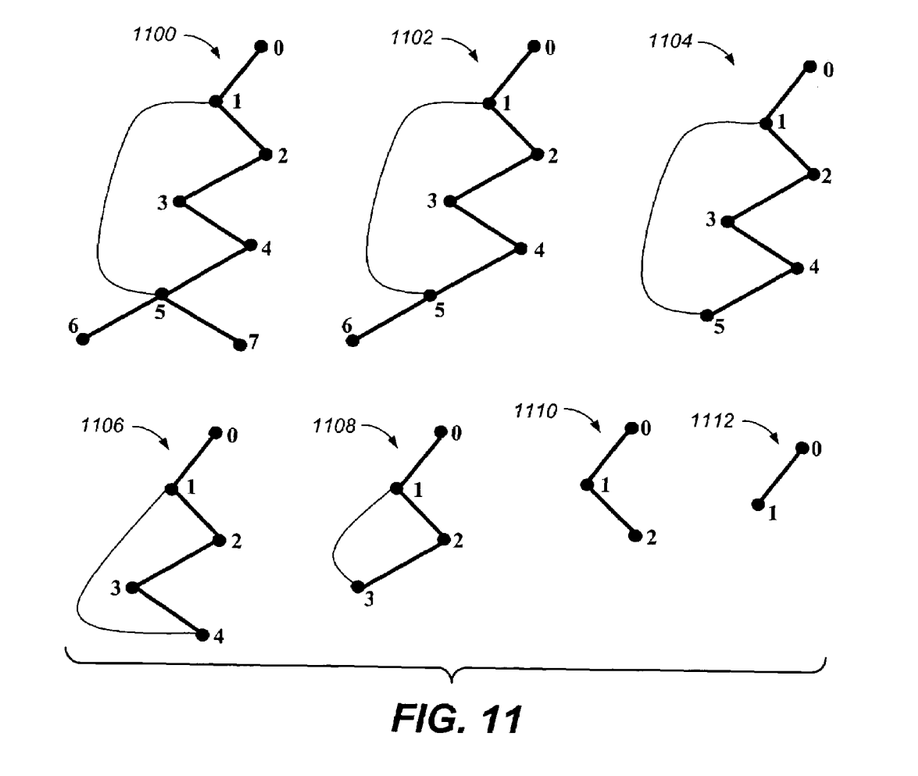
FIG. 11 illustrates an example of optimizing the order of the node elimination in the graph reduction process in accordance with the present invention.

FIG. 11 illustrates an example of optimizing the order of the node elimination in the graph reduction process in accordance with the present invention. Graph 1100 illustrates a spanning tree graph created by a DFS on an example circuit. The Graph 1100 is created by starting the DFS at node 0. The deepest node with the smallest degree on the graph is node 6 or 7, each having a degree of 1. In this example, node 7 is eliminated first. However, node 6 could be eliminated first. Node 7 is then eliminated using the degree 1 process described above, resulting in Graph 1102. In Graph 1102, node 6 is the deepest node with the smallest degree in the graph 1102. Node 6 is then eliminated using the degree 1 process, resulting in Graph 1104. In Graph 1104, node 5 is eliminated using the degree 2 process, resulting in Graph 1106. In Graph 1106, node 4 is eliminated using the degree 2 process, resulting in Graph 1108. In Graph 1108, node 3 is eliminated using the degree 2 process, resulting in Graph 1110. In Graph 1100, node 2 is eliminated using the degree 1 process, resulting in Graph 1112. In Graph 1112, node 1 is eliminated using the degree 1 process, resulting in a single node 0. Graph 1100 is thus completely reducible.

Figure 12:
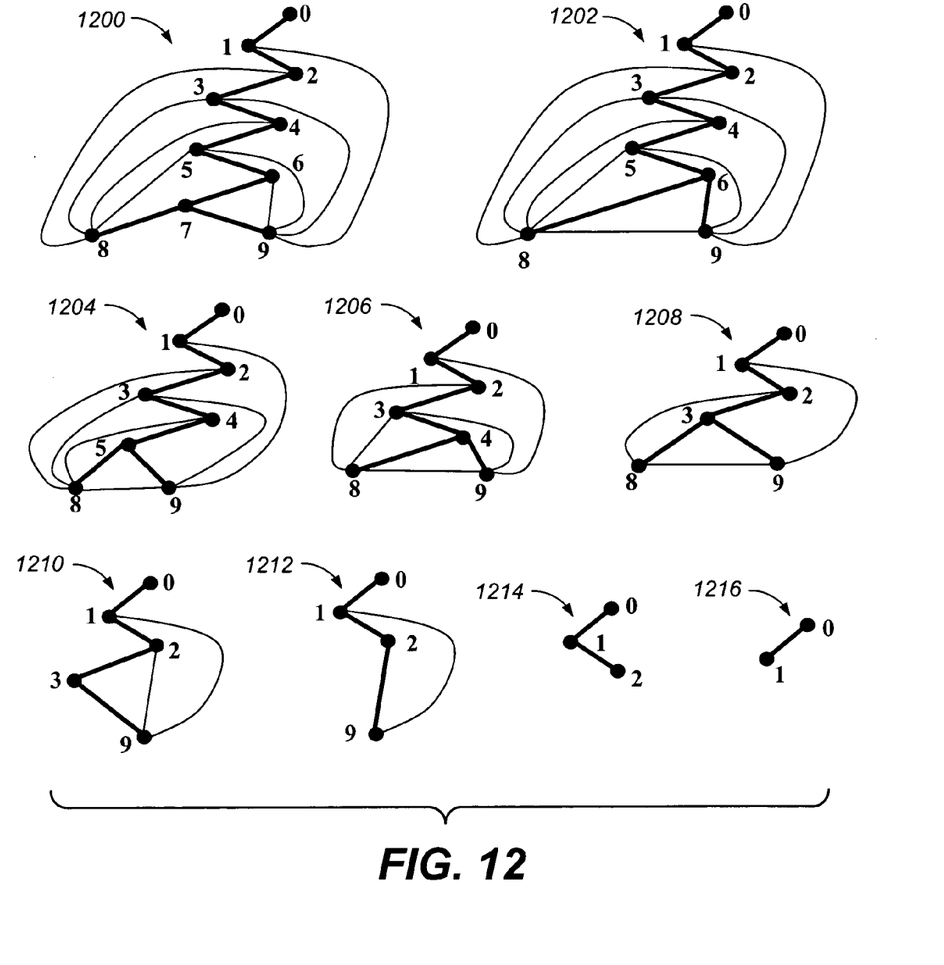
FIG. 12 illustrates another example of optimizing the order of the node elimination in the graph reduction process in accordance with the present invention.

FIG. 12 illustrates another example of optimizing the order of the node elimination in the graph reduction process in accordance with the present invention. Graph 1200 illustrates the spanning tree graph created by a DFS of another example circuit. The Graph 1200 is created by starting the DFS at node 0. In Graph 1200, the node with the smallest degree and deepest in the graph 1200 is node 7, having a degree of 3. Although node 6 also has a degree of 3, node 7 is deeper in the graph than node 6. Node 7 is then eliminated using the degree 3 process described above, resulting in Graph 1202. In Graph 1202, node 6 is the node with the smallest degree and deepest in the graph 1202. Node 6 is then eliminated using the degree 3 process, resulting in Graph 1204. In Graph 1204, node 5 is eliminated using the degree 3 process, resulting in Graph 1206. In Graph 1206, node 4 is eliminated using the degree 3 process, resulting in Graph 1208. In Graph 1208, nodes 8 and 9 are each of degree 3. In this example, node 8 is eliminated next using the degree 3 process, resulting in Graph 1210. However, node 9 could be eliminated next instead. In Graph 1210, node 3 is eliminated using the degree 2 process, resulting in Graph 1212. In Graph 1212, node 9 is eliminated using the degree 2 process, resulting in a Graph 1214. In Graph 1214, node 2 is eliminated using the degree 1 process, resulting in Graph 1216. In Graph 1216, node 1 is eliminated using the degree 1 process, resulting in a single node 0. The graph 1200 is thus completely reducible.

To further reduce the complexity of moment computation, nodes with degrees 1 or 2 are eliminated in a first DFS to reduce the graph. Then, a second DFS is performed on the reduced graph. Then nodes with degrees 3 or more are eliminated.

To further reduce the complexity of moment computation, the order of node elimination can be stored or cache for future reference. The order of node elimination would be identical for the computation of each moment order. By caching the order of node elimination for each graph, the process of determining the order need not be repeated, saving a significant amount of computations.

For example, Table 1 below illustrates an example of the information that can be cached for Graph 1100 (FIG. 11).

TABLE 1

| Vector Index | Eliminated Node Index | Degree of Elimination | Neighbor(s) of Elimination | Requirements to Compute Voltage | Voltage Computed, and Its Order of Computation |
|---|---|---|---|---|---|
| 0 | 7 | 1 | 5 | $I_7, V_5$ | $V_7, 7^{th}$ |
| 1 | 6 | 1 | 5 | $I_6, V_5$ | $V_6, 6^{th}$ |
| 2 | 5 | 2 | 4, 1 | $I_5, V_4, V_1$ | $V_5, 5^{th}$ |
| 3 | 4 | 2 | 3, 1 | $I_4, V_3, V_1$ | $V_4, 4^{th}$ |
| 4 | 3 | 2 | 2, 1 | $I_3, V_2, V_1$ | $V_3, 3^{rd}$ |
| 5 | 2 | 1 | 1 | $I_2, V_1$ | $V_2, 2^{nd}$ |
| 6 | 1 | 1 | 0 | $I_1, V_0$ | $V_1, 1^{st}$ |

The vector index identifies the order in which the nodes are eliminated, with the node of vector index 0 eliminated first. For Graph 1100, node 7 has vector index 0. Table 1 stores the fact that the degree 1 process is used to eliminate node 7 and that node 5 is a neighboring node affected by its elimination. Table 1 also stores the fact that $I_7$ and $V_5$ are required to compute the voltage at node 7, and that $V_7$ is the $7^{th}$ voltage to be computed in the order of computation. The same types of information is stored for each node eliminated. Thus, to compute the moments for subsequent orders, Table 1 is accessed to obtain the order of node elimination in reducing Graph 1100. Then, the moments are computed in the order set forth in the Voltage Computed column of Table 1.

For another example, Table 2 below illustrates an example of the information that can be cached for Graph 1200 (FIG. 12).

TABLE 2

| Vector Index | Eliminated Node Index | Degree of Elimination | Neighbor(s) of Elimination | Requirements to Compute Voltage | Voltage Computed, and Its Order of Computation |
|---|---|---|---|---|---|
| 0 | 7 | 3 | 6, 8, 9 | $I_7, V_6, V_8, V_9$ | $V_7, 9^{th}$ |
| 1 | 6 | 3 | 5, 8, 9 | $I_6, V_5, V_8, V_9$ | $V_6, 8^{th}$ |
| 2 | 5 | 3 | 4, 8, 9 | $I_5, V_4, V_8, V_9$ | $V_5, 7^{th}$ |

TABLE 2-continued

| Vector Index | Eliminated Node Index | Degree of Elimination | Neighbor(s) of Elimination | Requirements to Compute Voltage | Voltage Computed, and Its Order of Computation |
|---|---|---|---|---|---|
| 3 | 4 | 3 | 3, 8, 9 | $I_4, V_3, V_8, V_9$ | $V_4, 6^{th}$ |
| 4 | 8 | 3 | 3, 2, 9 | $I_8, V_3, V_2, V_9$ | $V_8, 4^{rd}$ |
| 5 | 3 | 2 | 2, 9 | $I_2, V_2, V_1$ | $V_3, 3^{nd}$ |
| 6 | 9 | 2 | 2, 1 | $I_9, V_2, V_1$ | $V_9, 3^{rd}$ |
| 7 | 2 | 1 | 1 | $I_2, V_1$ | $V_2, 2^{nd}$ |
| 8 | 1 | 1 | 0 | $I_1, V_0$ | $V_1, 1^{st}$ |

For Graph 1200, node 7 has vector index 0. Table 2 stores the fact that the degree 3 process is used to eliminate node 7 and that nodes 6, 8, and 9 are neighboring nodes affected by its elimination. Table 2 also stores the fact that $I_7, V_6, V_8,$ and $V_9$ are required to compute the voltage at node 7, and that $V_7$ is the $9^{th}$ voltage to be computed in the order of computation. The same types of information is stored for each node eliminated. Thus, to compute the moments for subsequent orders, Table 2 is accessed to obtain the order of node elimination in reducing Graph 1200. Then, the moments are computed in the order set forth in the Voltage Computed column of Table 2.

The graph reduction algorithm itself is now described in the context of the node elimination process and the order optimization process described above.

Figure 13A:
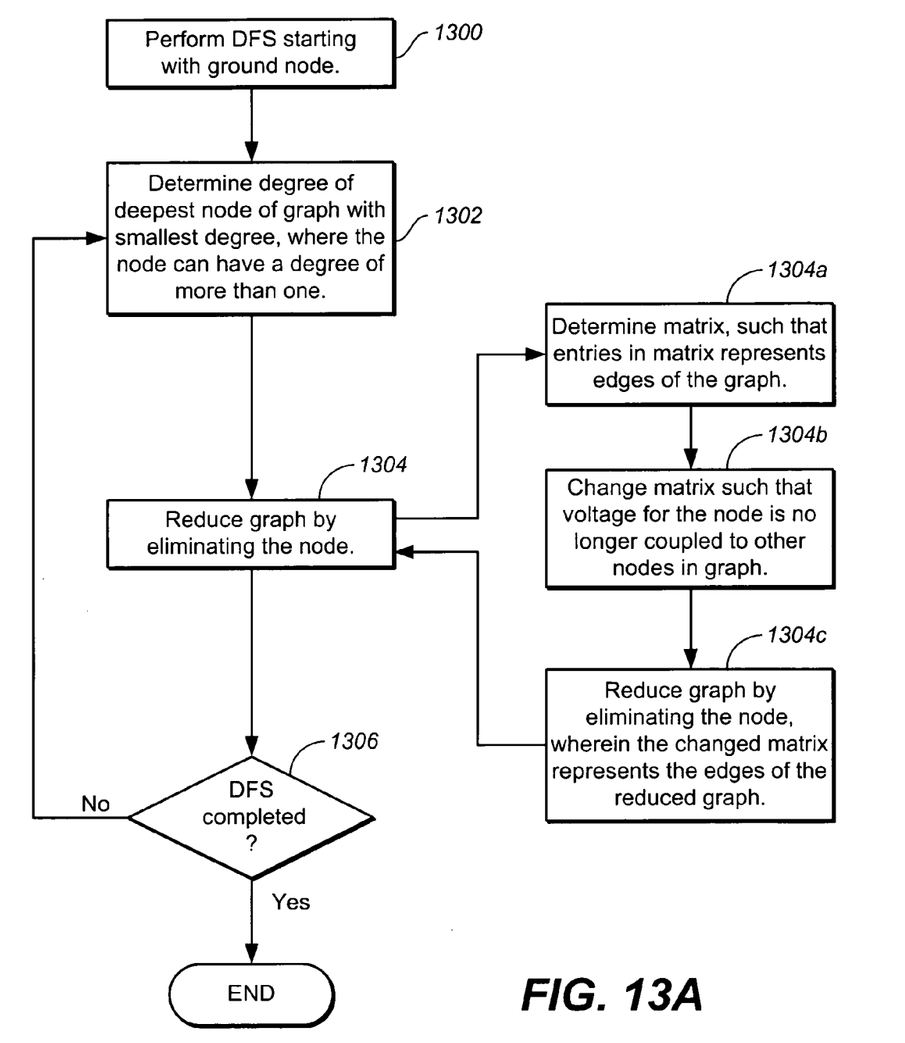
FIG. 13A is a flowchart illustrating a preferred embodiment of a graph reduction algorithm in accordance with the present invention.

FIG. 13A is a flowchart illustrating a preferred embodiment of a graph reduction algorithm in accordance with the present invention. First, DFS is performed starting with the ground node, via step 1300. Next, the degree of the deepest node with the smallest degree graph is determined, via step 1302, where the node can have a degree of more than one. Next, the graph is reduced by eliminating the node, via step 1304. Steps 1302 and 1304 are then performed recursively until the DFS completes, via step 1306.

Figure 2B:
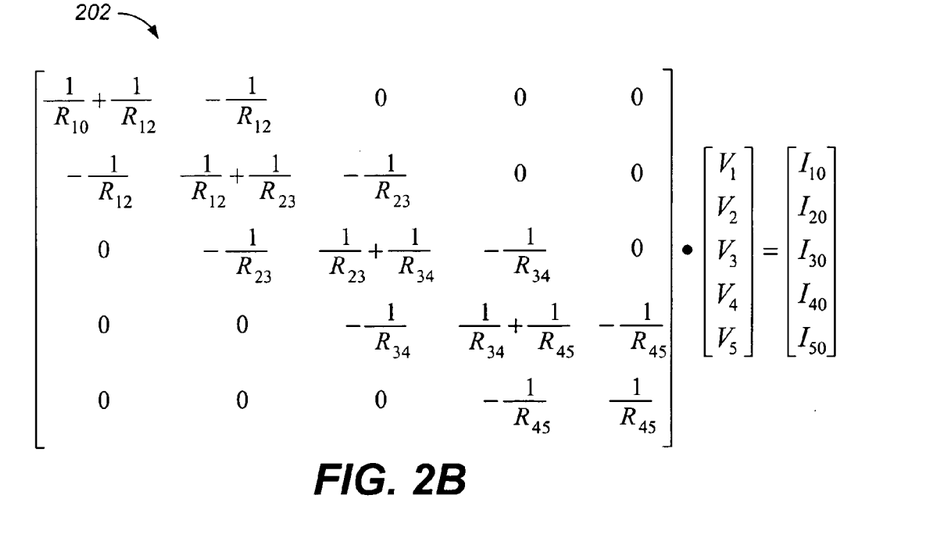
Figure 3:
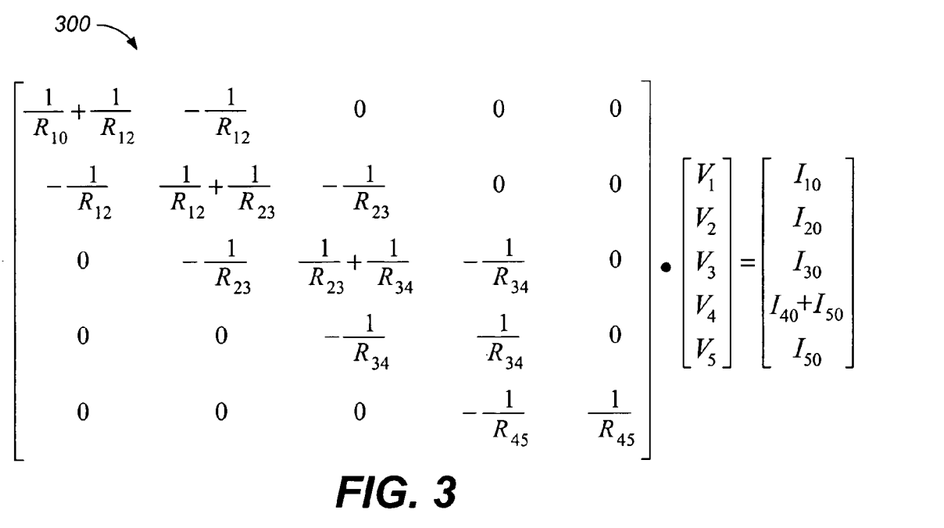

In reducing the parasitic graph, first a matrix for the graph is determined, via step 1304a, such that entries in the matrix represents edges of the graph. The matrix 202 illustrated in FIG. 2B is an example of such a matrix. Next, the matrix is changed such that the voltage for the node is no longer coupled to the other nodes in the graph, via step 1304b. The matrix 400 illustrated in FIG. 4A is an example of such a changed matrix. Then, the graph is reduced by eliminating the node, wherein the changed matrix represents the edges of the reduced graph, via step 1304c. The graph 402 illustrated in FIG. 4B is an example of the reduced graph. Using the matrix as described here is one method of performing the node elimination. Other methods can also be used.

Figure 13B:
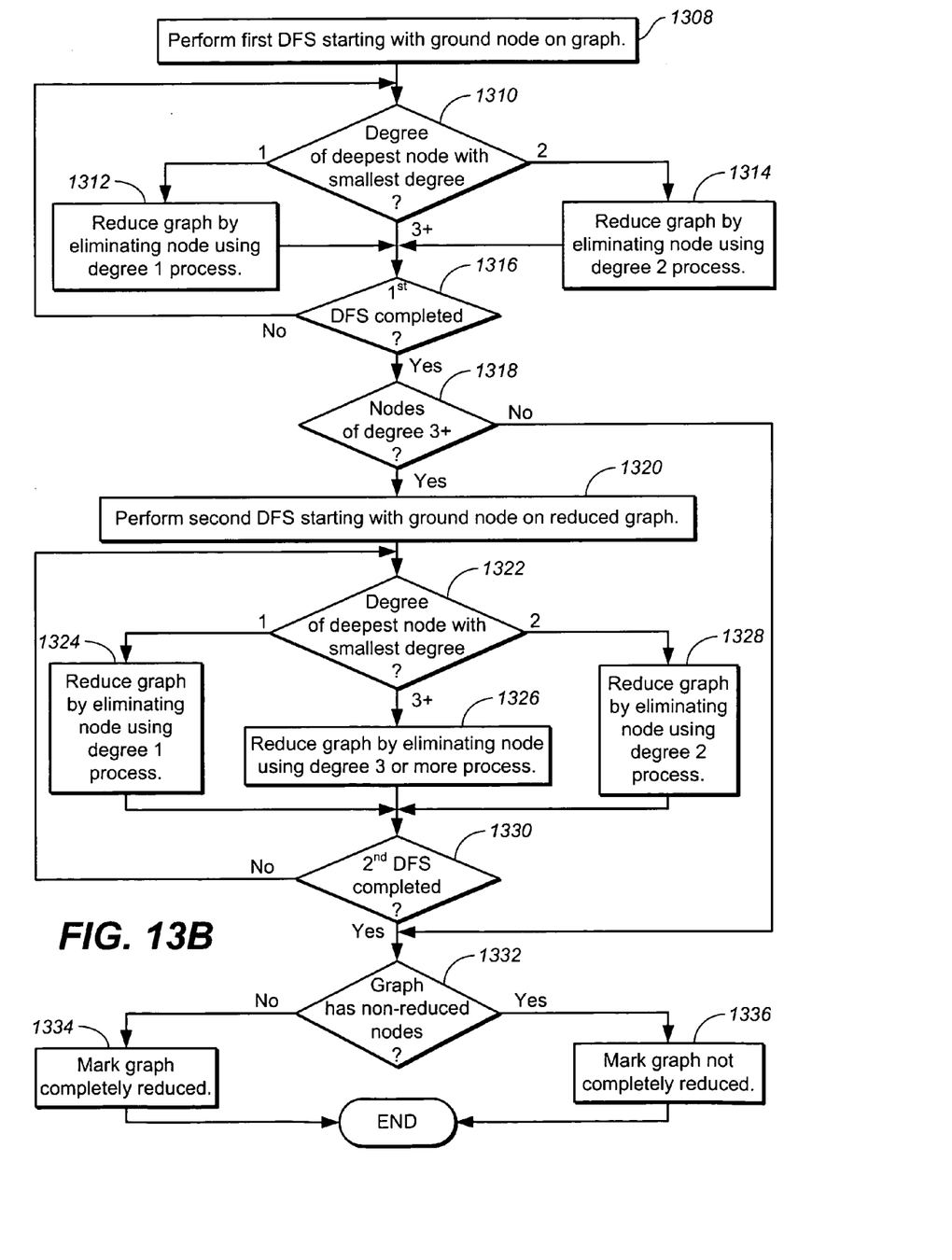
FIG. 13B is a flowchart illustrating in more detail the preferred embodiment of the graph reduction algorithm in accordance with the present invention.

FIG. 13B is a flowchart illustrating in more detail the preferred embodiment of the graph reduction algorithm in accordance with the present invention. Once a parasitic graph is for a circuit, DFS is performed starting with the ground node (node 0), via step 1308. In the preferred embodiment, to reduce the complexity of computations, the nodes with degrees 1 and 2 are eliminated first after a first DFS. The degree of the deepest node with the smallest degree is then determined, via step 1310, where the degree is either 1 or 2. If the node has a degree of 1, then the graph is reduced by eliminating the node using the degree 1 process, as described above, via step 1312. If the node has a degree of 2, then the graph is reduced by eliminating the node using the degree 2 process, as described above, via step 1314. If the node has a degree of 3 or more, and the first DFS has not completed, via step 1316, then the algorithm returns to step 1310. The deepest node with the smallest degree of the reduced graph is then found and steps 1310–1316 are repeated.

Once the nodes of degrees 1 or 2 have been eliminated, it is determined whether or not there are no more nodes to reduce, via step 1318, i.e., whether or not there are nodes of degree 3 or more. If there are no more nodes to reduce, then the algorithm continues to step 1332. At step 1332, it is determined if the graph has non-reduced nodes. If not, then the graph is marked as completely reduced, via step 1334. If so, then the graph is marked as not completely reduced, via step 1336.

If it is determined that there are more nodes to reduce, via step 1318, then a second DFS is performed starting with the ground node on the reduced graph, via step 1320. Then, the degree of the deepest node with the smallest degree is determined, via step 1322. If the degree of the node is 3 or more, then the graph is reduced by eliminating the node using the degree 3 or more process, via step 1326. Once the degree of 3 or more node has been eliminated, the degree of adjacent nodes may decrease. If the second DFS has not completed, via step 1330, then the algorithm returns to step 1320 and again determines the degree of the deepest node with the smallest degree, with the previous node eliminated. If the next node has the degree of 1, then the graph is reduced by eliminated the node using the degree 1 process, via step 1324. If the degree of the next node is 2, then the graph is reduced by eliminating the node using the degree 2 process, via step 1328. If the degree of the next node is 3 or more, then the graph is reduced by eliminating the node using the degree 3 or more process, via step 1326. If the second DFS has not completed, via step 1330, then the algorithm again returns to step 1322. If it has completed, then it is determined if the graph has any non-reduced nodes, via step 1332. If it does, then the graph is marked as completely reduced, via step 1334. If it does not, then the graph is marked as not completely reduced, via step 1336.

Figure 14:
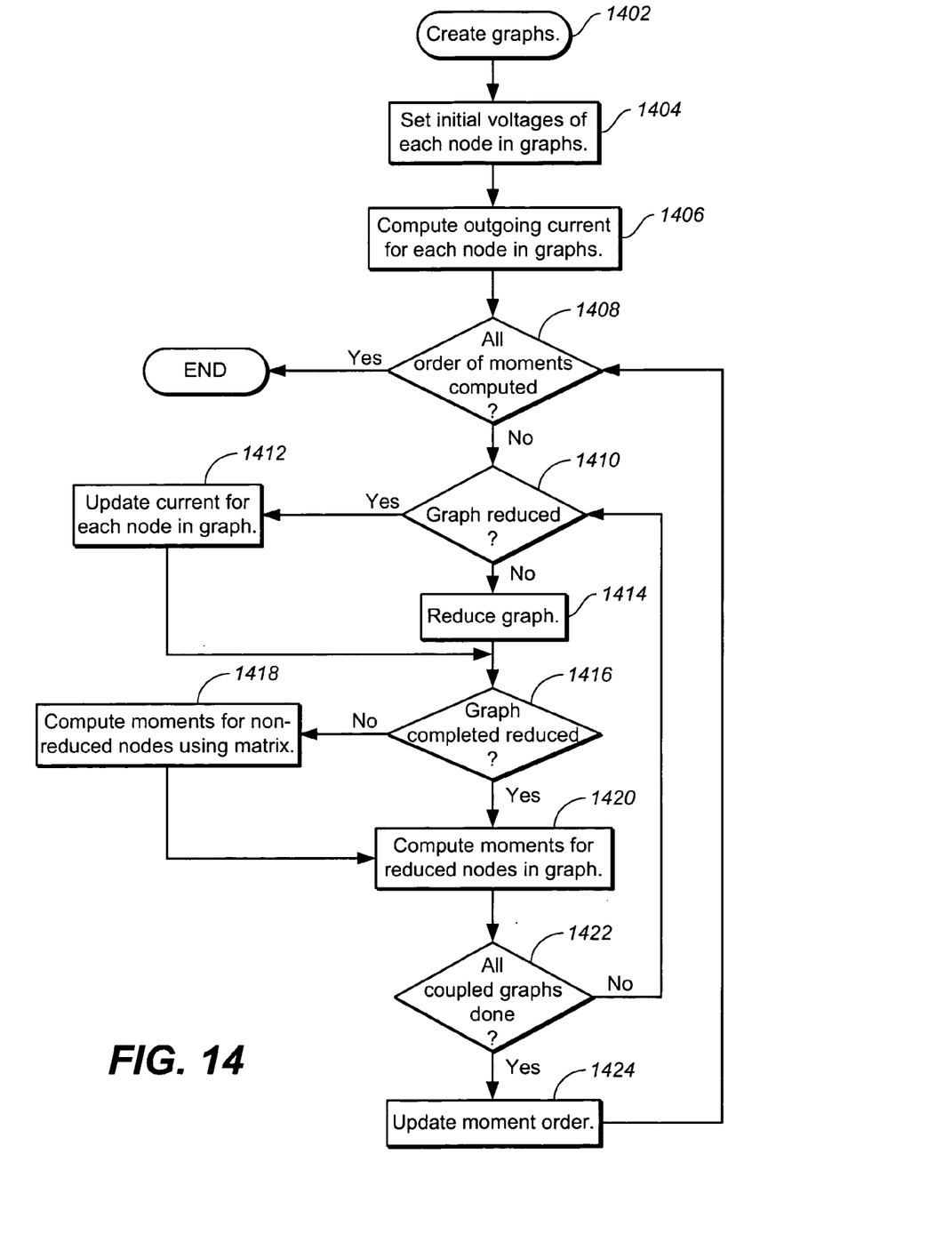
FIG. 14 is a flowchart illustrating a preferred embodiment of a moment computation algorithm using the graph reduction algorithm in accordance with the present invention.

FIG. 14 is a flowchart illustrating a preferred embodiment of a moment computation algorithm using the graph reduction algorithm in accordance with the present invention. First, parasitic graphs are created for each set of nodes for a circuit model for a VLSI chip, via step 1402. Typically, a VLSI chip is modeled by a plurality of coupled sets of nodes. Each set of nodes is represented by a parasitic graph. Once the graphs are created, then the initial voltages of each node in the graphs are set, via step 1404.

In the preferred embodiment, the initial voltages are set in such way that coupling capacitance is accounted for. For each set, one graph is selected as an "aggressor" graph, whose voltage will be set to account for the effects of coupling capacitance. The remainder of the nodes on other graphs in the set are "victim" nodes, whose voltages are affected by the voltage of the aggressor node. For each set of nodes, the aggressor node is set at an initial voltage, such as 1V. The victim nodes are set at another initial voltage, such as 0V. Once the initial voltages for each node is set, the outgoing currents for each node in the graphs are computed, via step 1406. These computed outgoing currents are then used to compute the moments at each node.

The first order of moments is first computed, thus it is determined that not all of the order of moments for the graphs have been computed, via step 1408. Steps 1410 through 1422 are then performed for each graph. In step 1410, for each graph, it is determined if the graph has been reduced. If the graph has been reduced, then the current for each node in the graph is updated, via step 1412. If not, then the graph reduction process is performed, via step 1414. In the preferred embodiment, the graph reduction process via step 1414 is accomplished by performing the algorithm illustrated in FIGS. 13A–13B and described above.

Once the graph is reduced, via step 1414, then it is determined if the graph has been marked as completely reduced, via step 1416. If it is not, then the moment for the non-reduced nodes are computed using a matrix representing the edges in the graph, via step 1418. Next, the moments for the reduced nodes are computed, via step 1420, using the solutions obtained from the matrix, if applicable.

If moments still need to be computed for other graphs, via step 1422, then the algorithm returns to step 1410. Steps 1410 through 1422 are then repeated for the next graph. When it is determined that moments for all of the graphs have been computed, via step 1422, then the moment order is updated, via step 1424. In updating the moment order, the voltages at each node are updated to the voltages computed from the previous order of moment computation. New outgoing currents for each node in the graphs are then computed to be used to solve the next order of moments. The algorithm then returns to step 1408, where it is determined if all order of moments have been computed. If not, then steps 1410 through 1424 are repeated for the next order of moments. For a circuit with q poles, 2q−1 order of moments are computed.

An improved method for interconnect delay analysis for VLSI circuits has been disclosed. The method reduces a parasitic graph for moment computation by eliminating one or more nodes in the graph. The elimination process is performed based upon the degree of the nodes. By eliminating nodes in this fashion, the computation complexity is significantly reduced. With this elimination process, resistor loops and crossed loops can also be solved. The order in which the nodes are eliminated is optimized using the depth-first-search method on the parasitic graphs, further reducing the computation complexity. The method provides a consistent functional interface, applicable to different circuit model structures. In addition, the method accounts for coupling capacitance between interconnects.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for reducing a parasitic graph for an interconnect model circuit, the parasitic graph comprising a plurality of nodes, comprising the steps of:
   (a) performing a depth-first-search on the graph;
   (b) determining a degree of a deepest node with a smallest degree, wherein the node can have a degree of more than one;
   (c) reducing the graph by eliminating the node, wherein the node is a member of a resistor loop, wherein the reducing comprises:
      (c1) determining a matrix, wherein each entry of the matrix represents an edge of the graph,
      (c2) changing the matrix such that a voltage at the node is no longer coupled to other nodes in the graph, and
      (c3) reducing the graph by eliminating the node, wherein the changed matrix represents edges of the reduced graph; and
   (d) recursively performing the determining step (b) and the reducing step (c) until the depth-first-search completes.

2. The method of claim 1, comprising:
   (a1) performing a first depth-first-search on the graph;
   (b1) determining the degree of the deepest node with the smallest degree, wherein the node has a degree of one or two;
   (c1) reducing the graph by eliminating the node; and
   (d1) recursively performing the determining step (b1) and the reducing step (c1) until the first depth-first-search completes.

3. The method of claim 2, further comprising:
   (e) determining if nodes with degrees of three or more remain in the reduced graph;
   (f) performing a second depth-first-search on the reduced graph, if nodes with degrees of three or more remain in the reduced graph;
   (g) determining a degree for another deepest node with a smallest degree, wherein the other node has a degree of three or more;
   (h) further reducing the reduced graph by eliminating the other node, wherein the other node is a member of another resistor loop; and
   (i) recursively performing the determining step (f) and the further reducing step (g) until the second depth-first-search completes.

4. The method of claim 1, further comprising:
   (e) determining if the reduced graph has any non-reduced nodes;
   (f) marking the reduced graph as completely reduced if there are no non-reduced nodes; and
   (g) marking the reduced graph as not completely reduced if there are non-reduced nodes.

5. The method of claim 1, wherein the degree of the node of the graph is a number of edges coupled to the node.

6. A method for reducing a parasitic graph for a interconnect model circuit, he parasitic graph comprising a plurality of nodes, comprising the steps of:
   (a) performing a first depth-first-search on the graph;
   (b) determining a degree of a deepest node with the smallest degree, wherein the node has a degree of one or two;
   (c) reducing the graph by eliminating the node, wherein the node is a member of a resistor loop, wherein the reducing comprises:
      (c1) determining a matrix, wherein each entry of the matrix represents an edge of the graph,
      (c2) changing the matrix such that a voltage at the node is no longer coupled to other nodes in the graph, and
      (c3) reducing the graph by eliminating the node, wherein the changed matrix represents edges of the reduced graph;

(d) recursively performing the determining step (b) and the reducing step (c) until the first depth-first-search completes;
(e) determining if nodes of degrees of three or more remain in the reduced graph;
(f) performing a second depth-first-search on the reduced graph, if nodes of degrees of three of more remain in the reduced graph;
(g) determining a degree for another deepest node with a smallest degree, wherein the other node has a degree of three or more;
(h) further reducing the reduced graph by eliminating the other node, wherein the other node is a member of another resistor loop; and
(i) recursively performing the determining step (g) and the further reducing step (h) until the second depth-first-search completes.

7. A computer readable medium with program instructions for reducing a parasitic graph for an interconnect model circuit, the parasitic graph comprising a plurality of nodes, comprising the instructions for:

(a) performing a depth-first-search on the graph;
(b) determining a degree of a deepest node with a smallest degree, wherein the node has a degree of more than one;
(c) reducing the graph by eliminating the node, wherein the node is a member of a resistor loop, wherein the reducing comprises:
  (c1) determining a matrix, wherein each entry of the matrix represents an edge of the graph,
  (c2) changing the matrix such that a voltage at the node is no longer coupled to other nodes in the graph, and
  (c3) reducing the graph by eliminating the node, wherein the changed matrix represents edges of the reduced graph; and
(d) recursively performing the determining instruction (b) and the reducing instruction (c) until the depth-first-search completes.

* * * * *